United States Patent
Takeuchi et al.

(10) Patent No.: US 6,441,537 B1
(45) Date of Patent: *Aug. 27, 2002

(54) PIEZOELECTRIC/ELECTROSTRICTIVE ACTUATOR HAVING AT LEAST ONE PIEZOELECTRIC/ELECTROSTRICTIVE FILM

(75) Inventors: Yukihisa Takeuchi, Nagoya; Koji Kimura, Komaki; Masato Komazawa, Nagoya, all of (JP)

(73) Assignees: NGK Insulators, Ltd. (JP); Seiko Epson Corp. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/384,469

(22) Filed: Feb. 2, 1995

Related U.S. Application Data

(63) Continuation of application No. 08/102,960, filed on Aug. 6, 1993, now abandoned, which is a continuation of application No. 07/860,128, filed on Mar. 31, 1992, now abandoned, which is a continuation of application No. 07/550,977, filed on Jul. 11, 1990, now abandoned.

(30) Foreign Application Priority Data

Jul. 11, 1989 (JP) .............................. 1-178747
Jan. 20, 1990 (JP) ................................ 2-11174

(51) Int. Cl.$^7$ .............................. H01L 41/08

(52) U.S. Cl. ...................... 310/328; 310/324; 310/330; 310/358

(58) Field of Search ................. 310/357–359, 310/323, 328, 324, 363–366, 330–332

(56) References Cited

U.S. PATENT DOCUMENTS

| | | | | |
|---|---|---|---|---|
| 2,540,194 A | | 2/1951 | Ellett | 310/359 X |
| 3,509,387 A | * | 4/1970 | Thorn et al. | 310/321 X |
| 4,456,850 A | * | 6/1984 | Inoue et al. | 310/331 X |
| 4,491,761 A | | 1/1985 | Grudkowski et al. | 310/358 |
| 4,564,851 A | * | 1/1986 | Nilsson et al. | 310/330 X |
| 4,633,120 A | * | 12/1986 | Sato et al. | 310/359 X |
| 4,649,313 A | * | 3/1987 | Ogawa et al. | 310/332 X |
| 4,680,595 A | | 7/1987 | Cruz-Uribe et al. | 346/140 |
| 4,742,260 A | * | 5/1988 | Shimizu et al. | 310/330 X |
| 4,742,264 A | * | 5/1988 | Ogawa | 310/359 X |
| 4,766,671 A | * | 8/1988 | Utsumi et al. | 29/848 |
| 4,780,639 A | * | 10/1988 | Shirasu | 310/358 X |
| 4,783,821 A | * | 11/1988 | Muller et al. | 310/324 X |
| 4,825,227 A | * | 4/1989 | Fischbeck et al. | 310/359 X |
| 4,906,840 A | * | 3/1990 | Zdeblick et al. | 310/332 X |
| 5,126,615 A | * | 6/1992 | Takeuchi et al. | 310/324 X |

FOREIGN PATENT DOCUMENTS

| | | | | |
|---|---|---|---|---|
| EP | 0262637 | | 4/1988 | |
| FR | 2570223 | | 3/1986 | |
| GB | 2161647 | | 1/1986 | |
| JP | 45-6103 | | 3/1970 | |
| JP | 4626140 | | 9/1971 | |
| JP | 62-213399 | * | 9/1987 | 310/358 |
| WO | 89/07259 | | 8/1989 | |

\* cited by examiner

*Primary Examiner*—Mark O. Budd
(74) *Attorney, Agent, or Firm*—Parkhurst & Wendel, LLP

(57) ABSTRACT

A piezoelectric/electrostrictive actuator including a ceramic substrate, and at least one piezoelectric/electrostrictive actuator unit formed on at least a portion of at least one surface of the substrate, each piezoelectric/electrostrictive actuator unit having a first electrode film, a piezoelectric/electrostrictive film and a second electrode film which are laminated in the order of description, with the piezoelectric/electrostrictive actuator unit formed on the substrate by heat treatment.

12 Claims, 5 Drawing Sheets

PIEZOELECTRIC/ELECTROSTRICTIVE ACTUATOR HAVING AT LEAST ONE PIEZOELECTRIC/ELECTROSTRICTIVE FILM

This is a Continuation of application Ser. No. 08/102,960 filed Aug. 6, 1993, now abandoned, which in turn is a Continuation of application Ser. No. 07/860,128 filed Mar. 31, 1992, now abandoned, which in turn is a Continuation of application Ser. No. 07/550,977 filed Jul. 11, 1990, now abandoned.

BACKGROUND OF THE INVENTION

1. Field of the Invention

The present invention relates to a bi-morph or uni-morph type piezoelectric or electrostrictive actuator used as or for a displacement-controllable element, a solid element motor, an ink jet ejector, a relay, a switching element, a camera shutter, a print head, a pump, a fan or blower, and other components or devices. The term "actuator" used herein is a member capable of transducing or converting an electric energy into a mechanical force, displacement or strain.

2. Discussion of the Prior Art

Recently, an element whose displacement can be controlled has been widely used and increasingly needed in the fields of optics and precision positioning or machining operations, for example, for adjusting or changing an optical path length or the position of a member or component of a device, on the order of fractions of a micron ($\mu$m). To meet this need, there have been proposed and developed various piezoelectric or electrostrictive actuators utilizing a piezoelectric or electrostrictive material such as a ferroelectric material, which exhibits the reverse or converse piezoelectric effect or the electrostrictive effect, in which the application of a voltage or electric field to such a piezoelectric or electrostrictive material produces a mechanical displacement.

Conventionally, the piezoelectric/electrostrictive actuator is structurally classified into a mono-morph type, a uni-morph type, a bi-morph type and a lamination type. The mono-morph, uni-morph and bi-morph types provide a relatively large amount of bending or flexural displacement or deflection or distortion owing to the transverse mode of converse piezoelectric or electrostrictive effect, namely, due to the strain perpendicular to the direction of the electric field produced upon application of a voltage. However these types suffer from inherent problems such as a small magnitude of a force generated, a low response speed, a low level of electro-mechanical conversion efficiency, and a low degree of operating reliability due to the use of an adhesive for bonding the component layers. On the other hand, the lamination type utilizes the longitudinal mode of converse piezoelectric or electrostrictive effect, namely, the strain parallel to the direction of the electric field, and therefore assures a large magnitude of the generated force, a high response speed, and a high level of electro-mechanical conversion efficiency. However, the lamination type suffers from an inherent problem that the amount of displacement produced is relatively small.

The conventional piezoelectric/electrostrictive actuator of the uni-morph or bi-morph type also suffers from relatively low operating reliability, which arises from the use of a bonding agent for bonding together the component sheets or plates of the actuator such as a piezoelectric/electrostrictive element.

Thus, the conventional piezoelectric or electrostrictive actuators have drawbacks as well as advantages, and suffer from some problems that should be solved.

SUMMARY OF THE INVENTION

It is accordingly a first object of the present invention to provide a piezoelectric/electrostrictive actuator of uni-morph or bi-morph type which does not use a bonding adhesive or cement and which undergoes a sufficient amount of displacement by application of a relatively low voltage, with an improved response to the applied voltage.

Another object of the invention is to provide such a piezoelectric/electrostrictive actuator wherein piezoelectric/electrostrictive actuator units are formed with high integration density on a substrate or supports The above objects may be achieved according to the principle of the present invention, which provides a piezoelectric/electrostrictive actuator comprising a ceramic substrate, and at least one piezoelectric/electrostrictive actuator unit formed on at least a portion of at least one surface of the substrate. Each piezoelectric/electrostrictive actuator unit comprises a first electrode film, a piezoelectric or electrostrictive film and a second electrode film which are laminated in the order of description.

The piezoelectric/electrostrictive actuator of this invention wherein each piezoelectric/electrostrictive actuator unit consists of a laminar structure as described above provides a large amount of displacement by application of a relative low voltage applied thereto, with a high response to the applied voltage. Further, the laminar piezoelectric/electrostrictive actuator units may be formed with improved integration density on the substrate. Although the piezoelectric/electrostrictive actuator of the present invention which includes the laminated films integrally formed on the substrate is more or less similar in construction to the conventional bulk type laminar actuator, the present actuator is capable of undergoing a sufficient amount of flexural or bending displacement or distortion owing to the transverse mode of converse piezoelectric or electrostrictive effect produced upon application of an electric field, and generating an accordingly large force, while assuring improved operating response.

Further, the laminar structure including the electrode films and piezoelectric/electrostrictive film are integrally laminated on the substrate, without a bonding adhesive as conventionally used for bonding thin component sheets of the known actuator of the uni-morph or bi-morph type. Consequently, the present piezoelectric/electrostrictive actuator has improved operating reliability for a prolonged period of use, and the displacement to be produced by the actuator is subject to a minimum amount of drift.

The laminar structure according to the present invention permits the piezoelectric/electrostrictive actuator units to be easily formed with a relatively high density on the same surface of the substrate.

According to a finding of the applicants, for obtaining a large amount of flexural or bending displacement and the accordingly large magnitude of the force generated, the thickness of the present actuator is preferably 300 $\mu$m or less, and more preferably 150 $\mu$m or less, and the bending strength of the ceramic substrate is preferably at least 1200 kgf/cm$^2$, and more preferably at least 1500 kgf/cm$^{2.}$

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which FIG. 1 through FIG. 7 are fragmentary perspective views illustrating different forms of the piezoelectric/electrostrictive actuator of the present invention.

DETAILED DESCRIPTION OF THE PREFERRED EMBODIMENTS

Figure 1:
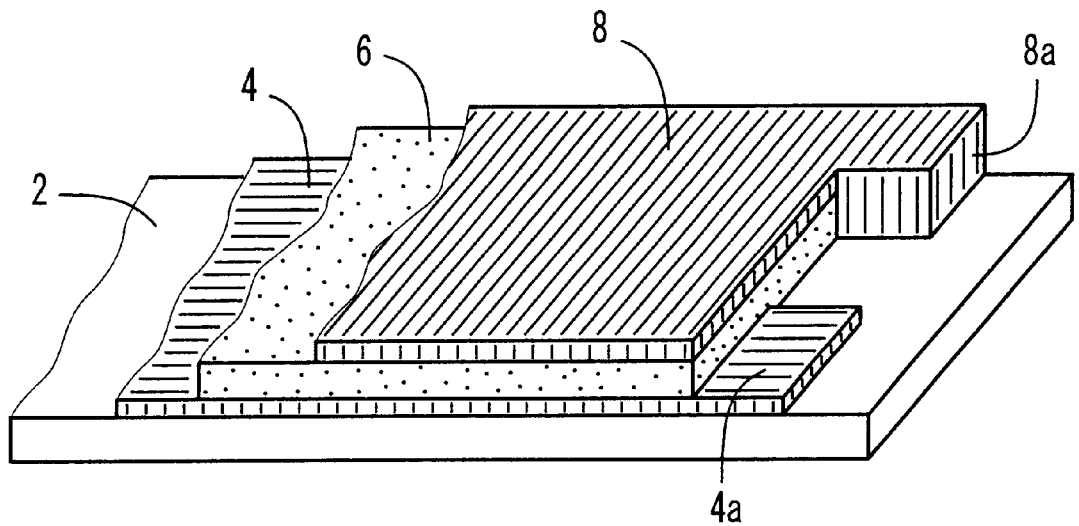

Referring first to FIG. 1, there is shown an example of the piezoelectric or electrostrictive actuator of the present invention, wherein a piezoelectric/electrostrictive actuator unit is formed on one of opposite major surfaces of a generally elongate rectangular ceramic substrate 2. The piezoelectric/electrostrictive actuator unit is a laminar structure consisting of a first electrode film 4, a piezoelectric/electrostrictive film 6 and a second electrode film 8, which are integrally formed on the substrate in the order of description. The first and second electrode films 4, 8 have respective terminal portions 4a, 8a which extend beyond the appropriate end face of the piezoelectric/electrostrictive film 6. The terminal portion 8a covers a part of the end face of the film 6. In operation of the actuator, a voltage is applied between the first and second electrode films 4, 8 through the terminal portions 4a, 8a.

Figure 2:
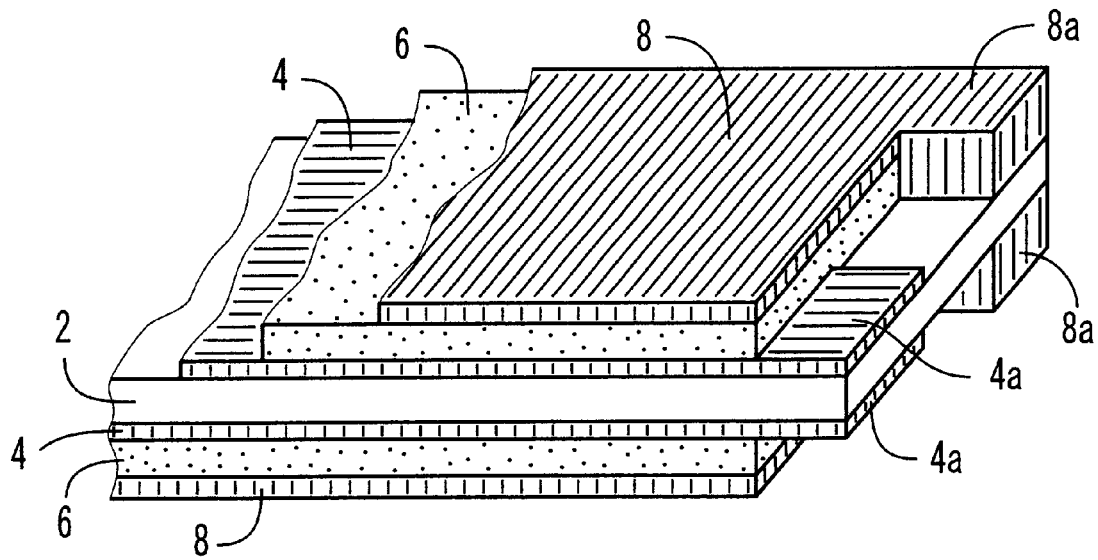

FIG. 2 shows an example of the piezoelectric/electrostrictive actuator in which two piezoelectric/electrostrictive actuator units are provided on the respective opposite major surfaces of the substrate 2. Each portion consists of the first and second electrode films 4, 8 and the piezoelectric/electrostrictive film 6 sandwiched by the two films 4, 6. The piezoelectric/electrostrictive actuator units (4, 6, 8) are structurally integrated with the substrate 2, by heat treatment.

Five different forms of the actuator which includes a plurality of piezoelectric/electrostrictive actuator units on the substrate 2 are illustrated in FIGS. 3 through 7, respectively. The piezoelectric/electrostrictive actuator units (4, 6, 8) are arranged in the direction which is either perpendicular or parallel to the major surfaces of the substrate 2, i.e., the plane of the substrate.

Figure 3:
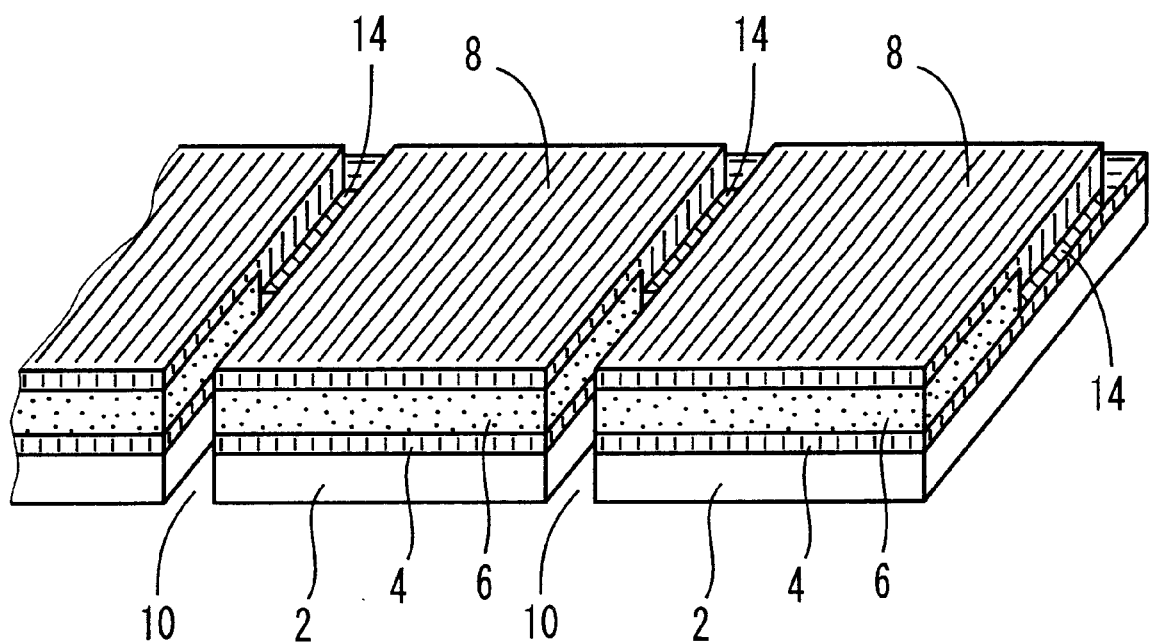
Figure 4:
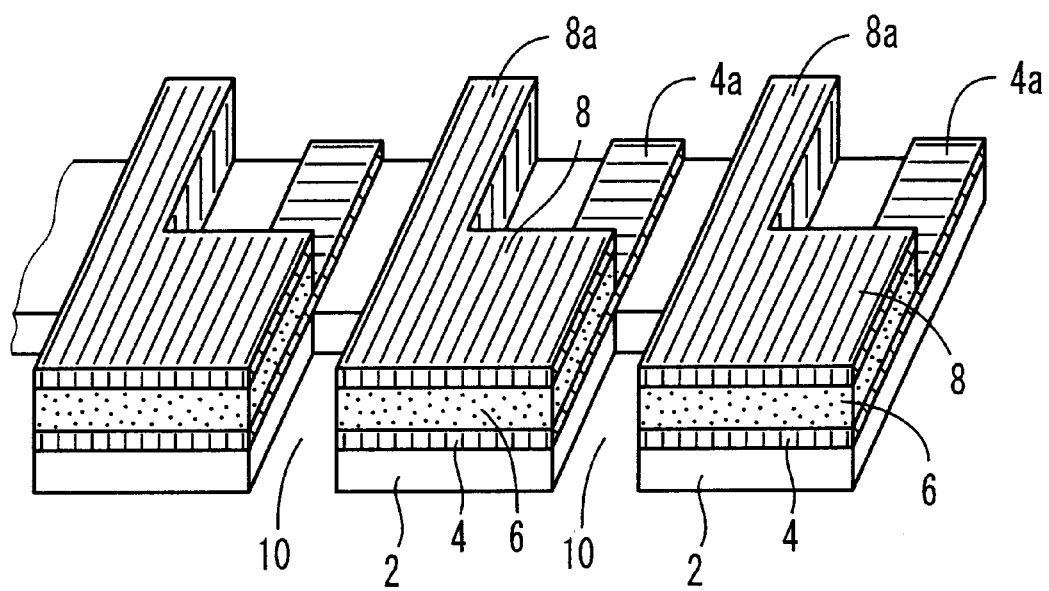
Figure 5:
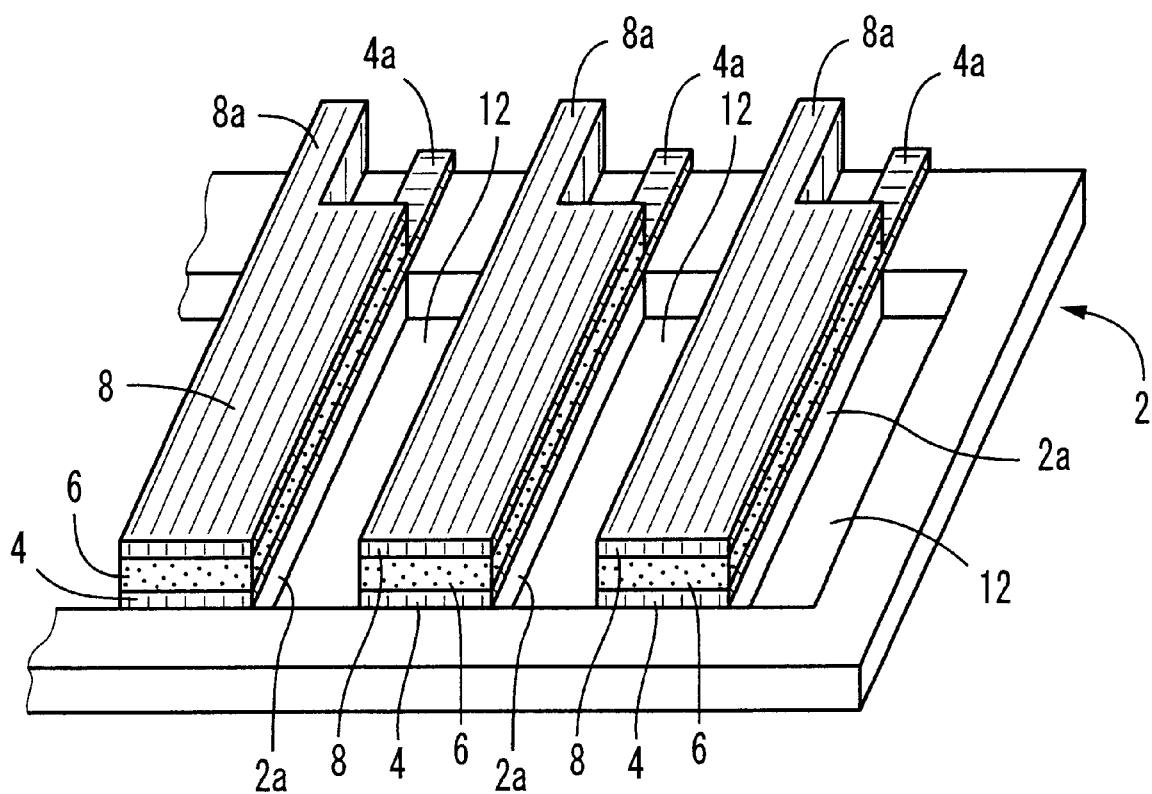

In the examples of FIGS. 3, 4 and 5, the plurality of piezoelectric/electrostrictive actuator units (4, 6, 8) are formed in parallel with each other on the same major surface of the elongate substrate 2, such that the piezoelectric/electrostrictive actuator units (4, 6, 8) are spaced from each other in the longitudinal direction of the substrate 2. In the actuator of FIGS. 3 and 4, the piezoelectric/electrostrictive actuator units (4, 6, 8) are separated from each other by rectangular slots 10 formed in respective portions of the ceramic substrate 2, each located between the adjacent piezoelectric/electrostrictive actuator units. The actuator of FIG. 3 has insulating films 14 which cover a rear part of the exposed end face of the piezoelectric/electrostrictive film 6, for electrically insulating the first and second electrode films 4, 8. In the actuator of FIG. 5, the ceramic substrate 2 has a plurality of elongate rectangular holes 12 formed therethrough at a suitable pitch in the longitudinal direction, so as to define a plurality of beam portions 2a. On each of the beam portions 2a of the substrate 2, there is formed a piezoelectric/electrostrictive actuator unit each consisting of the first electrode film 4, the piezoelectric/electrostrictive film 6 and the second electrode film 8.

Figure 6:
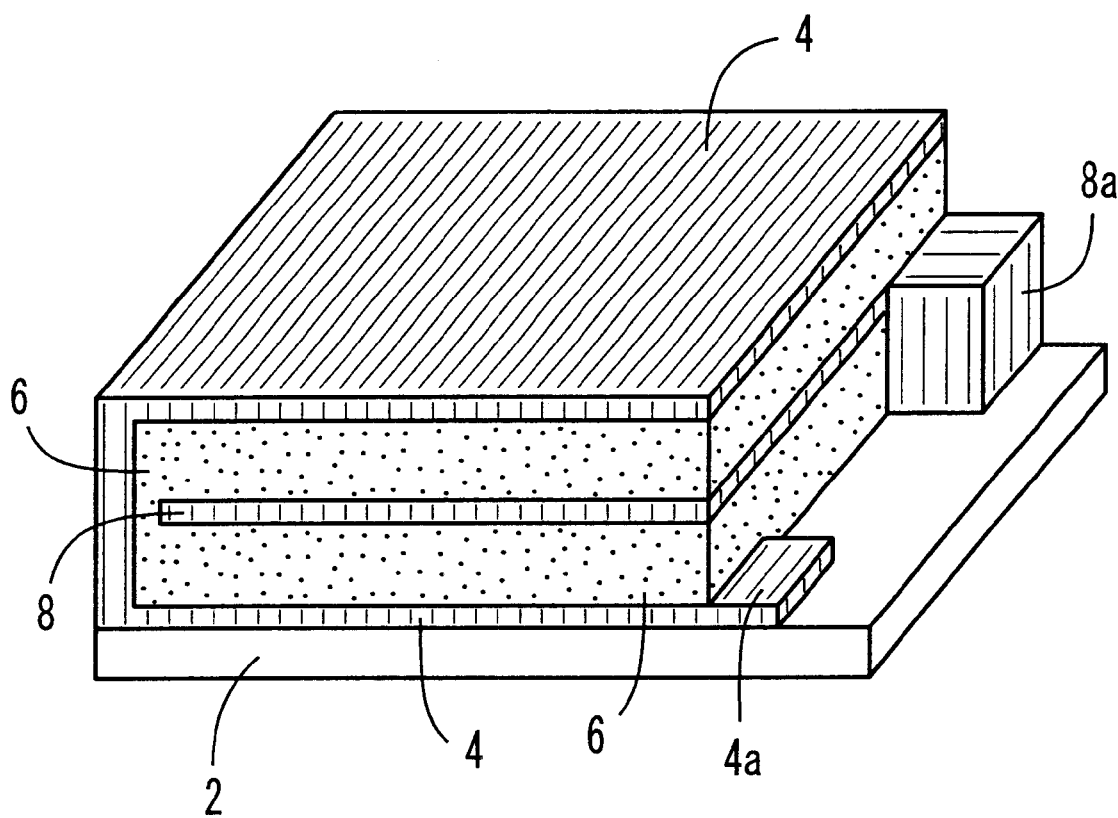

In the example of FIG. 6, the two piezoelectric/electrostrictive actuator units are superposed on each other on the same major surface of the ceramic substrate 2. More specifically, the first piezoelectric/electrostrictive actuator unit (4, 6, 8) is formed on the substrate 2, and the second piezoelectric/electrostrictive actuator unit (4, 6, 8) is formed on the first piezoelectric/electrostrictive actuator unit, such that the two first electrode films 4, 4, sandwich the two piezoelectric/electrostrictive films 6, 6 and the single common second electrode film 8, which separates the two films 6, 6 from each other. The two piezoelectric/electrostrictive actuator units and the substrate constitute an integrally formed lamination.

Figure 7:
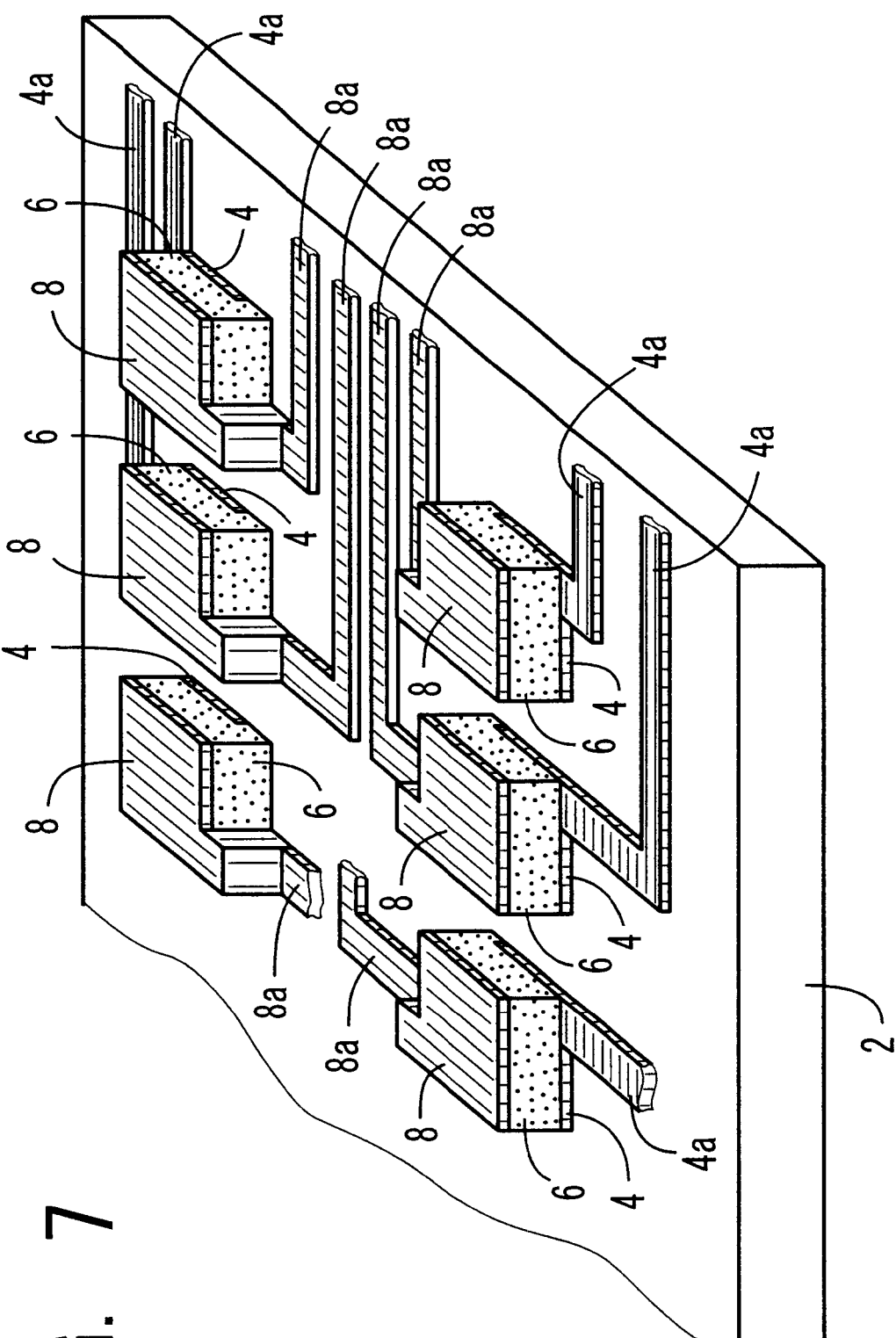

The piezoelectric/electrostrictive actuator illustrated in FIG. 7 uses a relatively large ceramic substrate 2, on which a plurality of piezoelectric/electrostrictive actuator units (4, 6, 8) are formed in two rows parallel to the length of the substrate, such that the piezoelectric/electrostrictive actuator units of each row are disposed at desired spacing distances. Each piezoelectric/electrostrictive actuator unit is a laminar structure consisting of the first and second electrode films 4, 8 and the piezoelectric/electrostrictive film 6 sandwiched between the two electrode films 4, 8, as described above.

In operation of the piezoelectric/electrostrictive actuators as illustrated above, a voltage is applied between the first and second electrode films 4, 8, so that the piezoelectric/electrostrictive film 6 is exposed to an electric field. As a result, the piezoelectric/electrostrictive film 6 is subject to strains due to the transverse mode of converse piezoelectric or electrostrictive effect produced by the electric field, whereby the film 6 undergoes a flexural or bending displacement and produces a force in the direction perpendicular to the plane of the ceramic substrate 2.

In the piezoelectric/electrostrictive actuator constructed according to the present invention, the electrode films 4, 8 and the piezoelectric/electrostrictive film 6 are formed of suitable electrode and piezoelectric or electrostrictive materials, so as to provide a laminar structure of the piezoelectric/electrostrictive actuator unit, which is integrated, by heat treatment, with the ceramic substrate 2 that functions as an oscillating or otherwise operating plate. Namely, the piezoelectric/electrostrictive actuator unit is bonded to the ceramic substrate in the fabrication process, without using a bonding adhesive. There will be described the fabrication process of the present actuator.

Initially, the first electrode film 4, piezoelectric/electrostrictive film 6 and second electrode film 8 are formed on the ceramic substrate 2, by a method selected from the various known film forming techniques, which include thick-film forming processes such as screen printing, coating processes such as dipping, spinning or spraying, and thin-film forming processes such as sputtering, ion-plating, vacuum vapor deposition, CVD and plating. Although the method of forming these films 4, 6, 8 is not limited to those indicated above, the screen printing and dipping methods are preferred for forming the piezoelectric/electrostrictive film 6, since these methods may use a paste or slurry whose major component consists of a piezoelectric or electrostrictive material, so as to give the film 6 the properties desired for the actuator. The films 4, 6, 8 may be usually patterned in a screen printing or photolithographic process. However, the films may be formed to desired shapes by removing unnecessary portions of the applied masses of the electrode and piezoelectric or electrostrictive materials, by laser machining, or slicing or other mechanical machining process. In particular, it is desirable to concurrently machine the ceramic substrate and the initially applied films into desired shapes, by the laser or mechanical machining process. This process facilitates the patterning of the piezoelectric/electrostrictive actuator units that are formed with high integration density on the substrate.

The construction and the shape or configuration of the actuator are not limited to those illustrated in the drawings, but may be suitably determined depending upon the application of the relevant actuator. For example, the actuator has a polygonal shape such as triangle, square, pentagon or hexagon, a generally round shape such as circle, ellipse or annulus, or any special shapes, which include a comb-like or lattice-like cellular configuration, and a combination of the two or more shapes indicated above. The principle of the present invention can be advantageously embodied as an actuator having two or more piezoelectric/electrostrictive actuator units formed on the same surface of the substrate, as illustrated in FIGS. 3–7. In particular, the comb-like arrangements of the piezoelectric/electrostrictive actuator units as shown in FIGS. 3–5 are advantageous for increased integration density, and improved displacement and force characteristics.

Where the actuator has a relatively large number of piezoelectric/electrostrictive actuator units on the same substrate, the spacing pitch of the piezoelectric/electrostrictive actuator units is preferably 3000 $\mu$m or less, more preferably 1000 $\mu$m or less, and most preferably 500 $\mu$m or less, so that the actuator has a considerably high integration density of the piezoelectric/electrostrictive actuator units.

The electrode and piezoelectric/electrostrictive films 4, 6, 8 formed on the ceramic substrate 2 by the selected method as described above may be either heat-treated in different steps for integration with the substrate 2 after each of these films is formed, or alternatively concurrently heat-treated in one step for integration with the substrate after at least two or all of the films are formed into a laminar structure on the substrate 2. However, the heat-treatment is not essential, when the film 8 is formed by ion-plating, sputtering, vacuum vapor deposition, CVD or plating. The heat-treatment temperature for integration of the films 4, 6, 8 with the ceramic substrate 2 is generally within a range between 800° C. and 1400° C., preferably within a range between 1100° C. and 1400° C. To avoid a change in the composition of the piezoelectric/electrostrictive material during heat-treatment of the film 6, it is desirable to control the heat-treatment atmosphere, by heating with the evaporation source of the piezoelectric/electrostrictive material. Since the first electrode film 4 is generally formed directly on the ceramic substrate 2, the bonding state between the first electrode film 4 and the substrate 2 may be improved under some conditions, by interposing an intermediate film between the first electrode film and the substrate. The "bonding state" is interpreted to mean the bonding strength or adhesion and the difference in the coefficient of thermal expansion at the bonding interface.

The ceramic composition for the ceramic substrate 2 may be either an oxide or a non-oxide insulating or dielectric material, which has a high value of mechanical strength and which can be heat-treated. Preferably, the major component of the ceramic composition consists of at least one material selected from among aluminum oxide, magnesium oxide, zirconium oxide, aluminum nitride and silicon nitride. For the substrate to exhibit excellent characteristics with a relatively small thickness, it is desirable that the ceramic composition for the substrate contains aluminum oxide or zirconium oxide as a major component. Further, the content of silicon oxide or dioxide (SiO, $SiO_2$) contained in the ceramic composition is preferably no more than 10% by weight, and more preferably no more than 3% by weight. The upper limit of the silicon oxide or dioxide is important for preventing reaction thereof with the piezoelectric or electrostrictive material during the heat-treatment process, which reaction influences the characteristics of the actuator produced.

According to a finding of the applicants, to assure a high level of operating response and a large amount of flexural or bending displacement or distortion, the thickness of the ceramic substrate 2 is preferably no more than 100 $\mu$m, more preferably no more than 50 $\mu$m, and most preferably no more than 30 $\mu$m, and the Young's modulus of the substrate is preferably between $1.5 \times 10^6$ kg/cm$^2$ and $4.5 \times 10^6$ kg/cm$^2$, and more preferably between $2.0 \times 10^6$ kg/cm$^2$ and $4.0 \times 10^6$ kg/cm$^2$.

The green sheet for the ceramic substrate 2 may be fired before the films 4, 6, 8 are formed on the substrate, or alternatively at least one of the films may be formed on the green sheet before the green sheet is co-fired with the films. However, the films are desirably applied to the sintered ceramic substrate 2, so as to minimize the undesirable warpage or bucking, and dimensional error of the substrate.

Like the piezoelectric/electrostrictive actuator as a whole, the ceramic substrate 2 may have a suitable shape or configuration, depending upon the application of the actuator. For example, the substrate 2 has a polygonal shape such as triangle or square, a generally round shape such as circle, ellipse and annulus, or any special shapes which include a comb-like or lattice-like shape, and a combination of the two or more shapes indicated above.

The electrode films 4, 8 used for the present piezoelectric/electrostrictive actuator may be formed of any electrically conductive material which can withstand a high-temperature oxidizing heat-treatment atmosphere. For instance, the films 4, 8 may be formed of a single metal, an alloy of metals, a mixture of a metal or alloy and an electrically insulating ceramic, or an electrically conductive ceramic. However, it is preferred that the electrode material has a major component which consists of a noble metal having a high melting point, such as platinum, palladium or rhodium, or an alloy such as silver-palladium alloy, silver-platinum alloy or platinum-palladium alloy. The ceramic material to be added to a metal or alloy to provide the above-indicated mixture for the electrode films 4, 8 is preferably the same as the ceramic material for the ceramic substrate 2 or the piezoelectric or electrostrictive ceramic material used for the piezoelectric/electrostrictive film 6. Where the ceramic material used for the ceramic substrate 2 is used as an additive to the material for the electrode films 4, 8, the content of the ceramic material is preferably within a range of 5–30% by volume. Where the piezoelectric or electrostrictive ceramic material is used for the films 4, 8, the content of the ceramic material is preferably within a range of 5–20% by volume. It is particularly desirable to use a mixture of the ceramic material for the substrate 2 and the ceramic material for the piezoelectric/electrostrictive film 6, as a ceramic additive to be added to the material for the electrode films 4, 8. The use of this ceramic mixture attains the same functions as attained by the intermediate film interposed between the substrate 2 and the electrode film 4, as described above.

While the thickness of the first and second electrode films 4, 8 of each piezoelectric/electrostrictive actuator unit are suitably selected depending upon the application of the actuator, the thickness of each electrode film is generally no more than 15 $\mu$m, and preferably no more than 5 $\mu$m.

The piezoelectric/electrostrictive film 6 used for the present actuator, may be formed of any piezoelectric or electrostrictive material which produces strain due to the reverse piezoelectric effect or the electrostrictive effect, as well known in the art. The piezoelectric or electrostrictive material may be a crystalline or non-crystalline material, a semi-conductor material, or a dielectric or ferroelectric ceramic material. Further, the piezoelectric or electrostrictive material may either require a treatment for initial polarization or poling, or may not require such a polarization treatment.

The major component of the piezoelectric/electrostrictive composition used preferably consists of lead zirconium titanate (PZT), lead magnesium niobate (PMN), lead nickel niobate (PNN), lead manganese niobate, lead antimony stannate, lead titanate, barium titanate, lead niobate, barium niobate, or a mixture thereof. Further, a material (such as PLZT) containing an oxide or compound of lanthanum (La), barium (Ba), niobium (Nb), Zinc (Zn), nickel (Ni) and/or manganese (Mn) may be added to the piezoelectric or electrostrictive composition whose major component consists of PZT.

In view of the construction of the piezoelectric/electrostrictive actuator according to the present invention, the piezoelectric constant $|d_{31}|$ of the material used for the piezoelectric/electrostrictive film 6 is desirably at least $50 \times 10^{-12}$ [C/N] and more desirably at least $100 \times 10^{-12}$ [C/N], for assuring excellent operating characteristics of the actuator. Further, the thickness of the film 6 is preferably no more than 100 μm, more preferably no more than 50 μm, and most preferably no more than 30 μm, for reducing the required level of a voltage to be applied to the film 6 through the films 4, 8.

While the presently preferred embodiments of the piezoelectric/electrostrictive actuator of this invention have been described in detail by reference to the drawings, it is to be understood that the invention is not limited to the details of the illustrated embodiments.

It is also to be understood that the present invention may be embodied with various changes, modifications and improvements, which may occur to those skilled in the art, without departing from the spirit and scope of the invention defined in the following claims.

What is claimed is:

1. A piezoelectric/electrostrictive actuator consisting essentially of a pre-sintered ceramic substrate, said substrate consisting of a ceramic sheet that consists essentially of a non-piezoelectric/electrostrictive material having a major component that consists of at least one material selected from the group consisting of aluminum oxide, magnesium oxide, zirconium oxide, aluminum nitride and silicon nitride, said ceramic sheet containing not greater than 3 wt. % of SiO or $SiO_2$; and at least one piezoelectric/electrostrictive actuator unit formed on at least a portion of at least one surface of the substrate without a bonding adhesive, each of said at least one piezoelectric/electrostrictive actuator unit consisting of:
a first electrode film consisting essentially of electrically conductive electrode material formed on said at least a portion of at least one surface of the substrate;
a piezoelectric/electrostrictive film consisting essentially of a piezoelectric/electrostrictive material formed on said first electrode film; and
a second electrode film consisting essentially of electrically conductive electrode material formed on said piezoelectric/electrostrictive film, wherein said piezoelectric/electrostrictive film is formed by a thick-film forming process, said films are laminated together without a bonding adhesive, and said films are heat-treated on said pre-sintered ceramic substrate to integrate said at least one piezoelectric/electrostrictive actuator unit with said pre-sintered ceramic substrate, at least said piezoelectric/electrostrictive film being heat-treated at a temperature between 1100° C. and 1400° C., said pre-sintered ceramic substrate having been sintered prior to formation of said films thereon, and wherein said piezoelectric/electrostrictive film has a piezoelectric constant of at least $100 \times 10^{-12}$ [C/N].

2. A piezoelectric/electrostrictive actuator according to claim 1, wherein said ceramic substrate has a Young's modulus within a range between $1.5 \times 10^6$ kg/cm² and $4.5 \times 10^6$ kg/cm².

3. A piezoelectric/electrostrictive actuator according to claim 1, which has a thickness of 300 μm or less, and wherein said ceramic substrate has a. bending strength of at least 1200 kgf/cm².

4. A piezoelectric/electrostrictive actuator according to claim 1, wherein said at least one piezoelectric/electrostrictive actuator unit consists of a plurality of piezoelectric/electrostrictive actuator units which are formed on said ceramic substrate such that said piezoelectric/electrostrictive actuator units are arranged in a direction perpendicular or parallel to a plane of said substrate.

5. A piezoelectric/electrostrictive actuator according to claim 1, wherein said ceramic substrate has a thickness of no more than 100 μm.

6. A piezoelectric/electrostrictive actuator according to claim 1, wherein said piezoelectric/electrostrictive film has a thickness of no more than 100 μm.

7. A piezoelectric/electrostrictive actuator according to claim 1, wherein said piezoelectric/electrostrictive film is capable of undergoing a bending displacement caused by a transverse mode of a converse piezoelectric effect or an electrostrictive effect upon application of a voltage between said first and second electrode films.

8. A piezoelectric/electrostrictive actuator consisting essentially of a pre-sintered ceramic substrate, said substrate consisting of a ceramic sheet that consists essentially of a non-piezoelectric/electrostrictive material having a major component that consists of at least one material selected from the group consisting of aluminum oxide, magnesium oxide, zirconium oxide, aluminum nitride and silicon nitride, said ceramic sheet containing not greater than 3 wt. % of SiO or $SiO_2$; and a plurality of piezoelectric/electrostrictive actuator units formed on said ceramic substrate without a bonding adhesive, said plurality of actuator units including two actuator units that are formed on opposite major surfaces of said ceramic substrate, each of said two actuator units consisting of:
a first electrode film consisting essentially of electrically conductive electrode material formed on said major surface of said ceramic substrate;
a piezoelectric/electrostrictive film formed on said first electrode film consisting essentially of a piezoelectric/electrostrictive material; and
a second electrode film consisting essentially of electrically conductive electrode material formed on said piezoelectric/electrostrictive film, wherein said piezoelectric/electrostrictive film is formed by a thick-film forming process, said films are laminated together without a bonding adhesive, and said films are heat-treated on said pre-sintered ceramic substrate to integrate said plurality of piezoelectric/electrostrictive actuator units with said pre-sintered ceramic substrate, at least said piezoelectric/electrostrictive film being heat-treated at a temperature between 1100° C. and 1400° C., said actuator being capable of undergoing a bending displacement caused by a transverse mode of a converse piezoelectric effect or an electrostrictive effect exhibited by said piezoelectric/electrostrictive film of said two actuator units upon application of a voltage between said first and second electrode films of said each actuator unit, said pre-sintered ceramic substrate having been sintered prior to formation of said films thereon, and wherein said piezoelectric/ electrostrictive film has a piezoelectric constant of at least $100 \times 10^{-12}$.

9. A piezoelectric/electrostrictive actuator consisting essentially of:

a pre-sintered ceramic substrate, said substrate consisting of a ceramic sheet that consists essentially of a non-piezoelectric/electrostrictive material having a major component that consists of at least one material selected from the group consisting of aluminum oxide, magnesium oxide, zirconium oxide, aluminum nitride and silicon nitride, said ceramic sheet containing not greater than 3 wt. % of SiO or $SiO_2$; and at least one piezoelectric/electrostrictive actuator unit formed on at least a portion of at least one surface of the substrate without a bonding adhesive, each of said at least one piezoelectric/electrostrictive actuator unit consisting of a first electrode film formed on said at least a portion of at least one surface of the substrate, a piezoelectric/electrostrictive film consisting essentially of a piezoelectric/electrostrictive material formed on said first electrode film and a second electrode film formed on said piezoelectric/electrostrictive film, wherein:

said first and second electrode films consist essentially of an electrically conductive material and at least one of said piezoelectric/electrostrictive material and the ceramic material used for the ceramic substrate;

said piezoelectric/electrostrictive film is formed by a thick-film forming process;

said films are laminated together without a bonding adhesive; and said films are heat-treated on said pre-sintered ceramic substrate to integrate said at least one piezoelectric/electrostrictive actuator unit with said pre-sintered ceramic substrate, at least said piezoelectric/electrostrictive film being heat-treated at a temperature between 1100° C. and 1400° C., said pre-sintered ceramic substrate having been sintered prior to formation of said films thereon, and said piezoelectric/electrostrictive film has a piezoelectric constant of at least $100 \times 10^{-12}$ [C/N].

10. The piezoelectric/electrostrictive actuator of claim 9, wherein the ceramic material used for said ceramic substrate is present in the first and second electrode films in the amount of 5–30% by volume.

11. The piezoelectric/electrostrictive actuator of claim 9, wherein said piezoelectric/electrostrictive material is present in the first and second electrode films in the amount of 5–20% by volume.

12. A piezoelectric/electrostrictive actuator consisting essentially of a pre-sintered ceramic substrate, said substrate consisting of a ceramic sheet that consists essentially of a non-piezoelectric/electrostrictive material having a major component that consists of at least one material selected from the group consisting of aluminum oxide, magnesium oxide, zirconium oxide, aluminum nitride and silicon nitride, said ceramic sheet containing not greater than 3 wt. % of SiO or $SiO_2$; and at least one piezoelectric/electrostrictive actuator unit formed on at least a portion of at least one surface of the substrate without a bonding adhesive, each of said at least one piezoelectric/electrostrictive actuator unit consisting of:

a first electrode film consisting essentially of one material selected from the group consisting of a single noble metal, an alloy including said noble metal, and a mixture of a ceramic and one of said alloy and said noble metal, said electrode film being formed on said at least a portion of at least one surface of the substrate;

a piezoelectric/electrostrictive film consisting essentially of a piezoelectric/electrostrictive material formed on said first electrode film; and a second electrode film consisting essentially of an electrode material and formed on said piezoelectric/electrostrictive film, wherein said piezoelectric/electrostrictive film is formed by a thick-film forming process, said films are laminated together without a bonding adhesive, and said films are heat-treated on said pre-sintered ceramic substrate to integrate said at least one piezoelectric/electrostrictive actuator unit with said pre-sintered ceramic substrate, at least said piezoelectric/electrostrictive film being heat-treated at a temperature between 1100° C. and 1400° C., said pre-sintered ceramic substrate having been sintered prior to formation of said films thereon, and said piezoelectric/electrostrictive film has a piezoelectric constant of at least $100 \times 10^{-12}$ [C/N].

* * * * *